(12) United States Patent
Galvez et al.

(10) Patent No.: US 7,618,157 B1
(45) Date of Patent: Nov. 17, 2009

(54) TUBULAR BLUE LED LAMP WITH REMOTE PHOSPHOR

(75) Inventors: Miguel Galvez, Danvers, MA (US);
Maria Anc, Groveland, MA (US);
Richard Speer, Concord, MA (US);
William A. George, Lynn, MA (US)

(73) Assignee: Osram Sylvania Inc., Danvers, MA (US)

(*) Notice: Subject to any disclaimer, the term of this patent is extended or adjusted under 35 U.S.C. 154(b) by 0 days.

(21) Appl. No.: 12/145,895

(22) Filed: Jun. 25, 2008

(51) Int. Cl.
F21V 29/00 (2006.01)

(52) U.S. Cl. .................. 362/294; 362/84; 362/218; 362/311.02; 362/311.04; 362/311.11

(58) Field of Classification Search ............ 362/84, 362/218, 223, 231, 240, 241, 242, 244, 247, 362/293, 294, 800, 311.02, 311.04, 311.09, 362/311.11, 311.14
See application file for complete search history.

(56) References Cited

U.S. PATENT DOCUMENTS

| 5,463,280 | A |  | 10/1995 | Johnson |
| 5,688,042 | A |  | 11/1997 | Madadi et al. |
| 5,949,347 | A |  | 9/1999 | Wu |
| 6,036,336 | A |  | 3/2000 | Wu |
| 6,283,612 | B1 |  | 9/2001 | Hunter |
| 6,583,550 | B2 |  | 6/2003 | Iwasa et al. |
| 6,634,779 | B2 |  | 10/2003 | Reed |
| 6,639,349 | B1 | * | 10/2003 | Bahadur ............ 362/260 |
| 6,762,562 | B2 |  | 7/2004 | Leong |
| 6,796,680 | B1 |  | 9/2004 | Showers et al. |
| 6,860,628 | B2 |  | 3/2005 | Robertson et al. |
| 6,940,101 | B2 |  | 9/2005 | Yano et al. |
| 7,114,830 | B2 |  | 10/2006 | Robertson et al. |
| 7,249,865 | B2 |  | 7/2007 | Robertson |
| 7,319,246 | B2 |  | 1/2008 | Soules et al. |
| 7,572,029 | B2 | * | 8/2009 | Tsai ..................... 362/247 |
| 2003/0156416 | A1 | * | 8/2003 | Stopa et al. ............ 362/294 |
| 2007/0058357 | A1 | * | 3/2007 | Yamaguchi et al. ...... 362/84 |
| 2008/0037245 | A1 | * | 2/2008 | Chan .................... 362/218 |
| 2009/0027878 | A1 | * | 1/2009 | Metz et al. ............. 362/218 |
| 2009/0168417 | A1 | * | 7/2009 | Zhang et al. ........... 362/294 |

* cited by examiner

*Primary Examiner*—Y My Quach Lee
(74) *Attorney, Agent, or Firm*—Robert F. Clark

(57) ABSTRACT

A lamp includes a linearly extending heat sink, blue-light-emitting LEDs mounted on the heat sink, and a light emitting cover mounted on the heat sink in line with the LEDs, a first portion of the cover opposite the LEDs including a phosphor that is excited by the LEDs to emit white light. The cover may be a tube with the LEDs outside the tube, a portion of the tube nearest the LEDs being transparent and receiving light from the LEDs. The tube may include reflectors that are attached to an exterior surface of the tube to hold the tube on the heat sink. Alternatively, the cover may enclose the LEDs on the heat sink, where a portion of the cover has an interior surface that reflects light from the LEDs to the first portion. The lamp may include electrical connections that allow for multiple lamps to be connected in series.

5 Claims, 2 Drawing Sheets

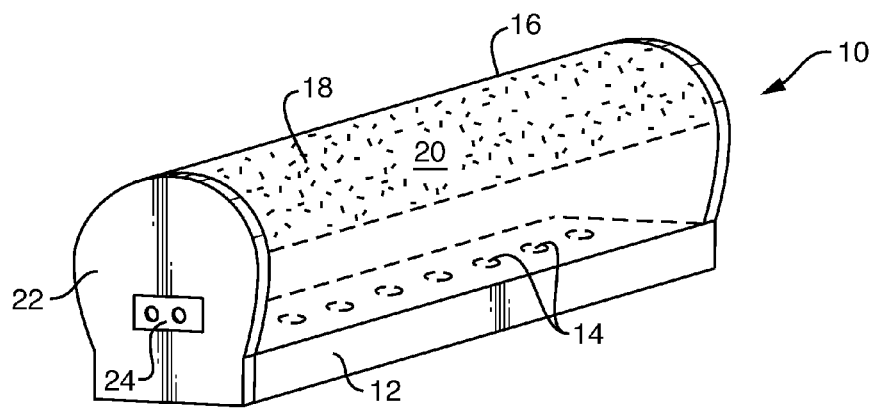
FIG. 1
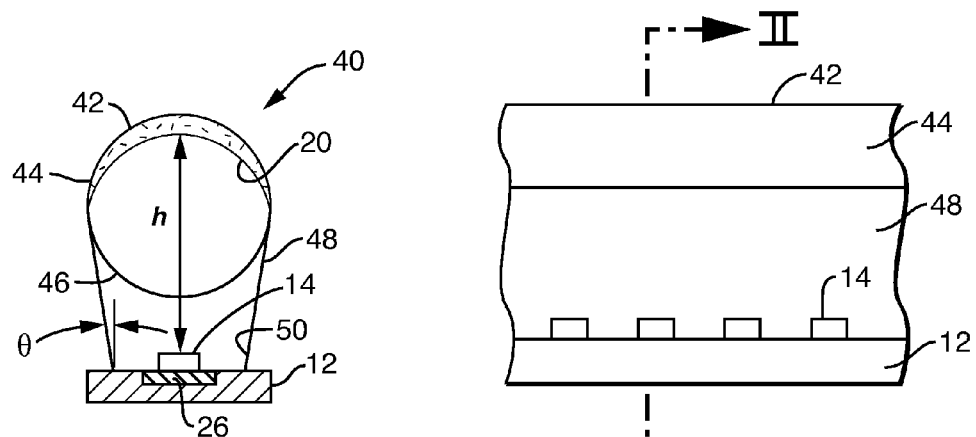
FIG. 2
FIG. 3

TUBULAR BLUE LED LAMP WITH REMOTE PHOSPHOR

BACKGROUND OF THE INVENTION

The present invention relates to electrical lighting devices and systems, and more particularly to lamps that include light emitting diodes (LEDs) but that resemble linear fluorescent lamps.

An LED is an electroluminescent diode that includes a semiconducting material doped with an impurity to form a p-n junction. When a forward bias is applied to the electrodes of the diode, charge carriers flow into the junction and recombine emitting photons. The energy of the photon, and therefore the wavelength of the light, depends on the band-gap energy of the materials forming the p-n junction. Materials for the LEDs can be selected so that the emitted light has a particular color, such as blue, green, amber, or red.

White LEDs often include a blue LED coated with a YAG:Ce phosphor. High power (one watt or more) blue LEDs are about 30-45% efficient, with about 550-700 mW going into heating the device for each watt applied. In addition, the phosphor conversion of blue light into yellow light in a white LED accounts for about 20% of the incident energy, which goes into heating the phosphor. LED technical specifications indicate that blue LEDs have a blue light power depreciation of about 7% (temperature 25-125° C.) while white LEDs have a power depreciation of about 20% at the same temperature. Thus, high power white LEDs impose significant thermal and lumen maintenance constraints.

Tubular lamps that use white LEDs are known. However, the LEDs appear as point sources along the length of the tubular cover so the light is not uniform. Some lamps use a refractive cover to the diffuse the light to achieve a more uniform illumination. It is also known to series-connect plural blue LEDs on a PCB board.

Various solutions are proposed in U.S. Pat. Nos. 5,463,280; 5,688,042; 5,949,347; 6,036,336; 6,283,612; 6,583,550; 6,634,779; 7,114,830; 7,249,865; 6,762,562; 6,796,680; and 6,940,101.

SUMMARY OF THE INVENTION

An object of the present invention is to provide a novel lamp that avoids the problems of the prior art.

A further object of the present invention is to provide a novel lamp that uses LEDs in a tubular arrangement and that includes easily assembled parts to facilitate manufacture of lamps with diverse characteristics.

A yet further object of the present invention is to provide a novel lamp that includes a linearly extending heat sink, plural LEDs mounted on the heat sink, and a light emitting cover mounted on the heat sink in line with the LEDs, where a first portion of the cover opposite the LEDs includes a phosphor that is excited by the LEDs to emit white light. The LEDs preferably emit blue light.

Another object of the present invention is to provide a novel lamp where the cover is a tube with the LEDs outside the tube, where a portion of the tube nearest the LEDs is transparent and receives light from the LEDs. The tube may include reflectors that are attached to an exterior surface of the tube to hold the tube on the heat sink.

Yet another object of the present invention is to provide a novel lamp where the cover encloses the LEDs on the heat sink, where a portion of the cover has an interior surface that reflects light from the LEDs to the first portion.

These and other objects and advantages of the invention will be apparent to those of skill in the art of the present invention after consideration of the following drawings and description of preferred embodiments.

BRIEF DESCRIPTION OF THE DRAWINGS

FIG. 1 is a pictorial representation of an embodiment of the lamp of the present invention.

FIGS. 2 and 3 are a cross-section and a partial side view of an embodiment of the lamp of the present invention.

DETAILED DESCRIPTION OF THE INVENTION

Figure 4:
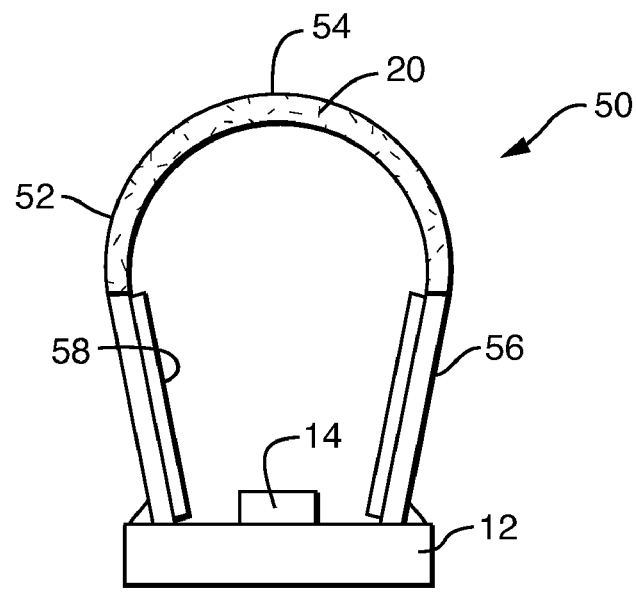
FIG. 4 is a cross-section of a further embodiment of the lamp of the present invention.

With reference now to FIG. 1, a lamp 10 of the present invention includes a linearly extending heat sink 12, plural light emitting diodes (LEDs) 14 mounted on heat sink 12 along a length of the heat sink, and a light emitting cover 16 mounted on heat sink 12 in line with LEDs 14, where a first portion 18 of cover 16 opposite LEDs 14 includes a phosphor 20 that is excited by light from the LEDs. Cover 16 emits a generally uniform light along its length. Heat sink 12 is made of a suitable thermally conductive material such as aluminum. Cover 16 is preferably transparent and made of a suitable material such as glass or plastic.

LEDs 14 preferably emit light having a wavelength in a range from 450 nm to 480 nm (blue light) and phosphor 20 preferably is a yellow-emitting phosphor, or a blend of yellow- and green-emitting phosphors, so that the light emitted from cover 16 is white. The LEDs and phosphors may be selected to provide light of a particular color, depending on the application. Preferably the LEDs are electrically connected in series in a conventional manner and evenly spaced along a length of the heat sink. LEDs afford the advantages of long life and small size and their combination with the heat sink and cover described herein provide the further advantage of ease of assembly of lamps for a variety of applications.

Lamp 10 preferably includes end caps 22 (e.g., made of aluminum) at opposite ends of cover 16 and heat sink 12, where end caps 22 have electrical connections 24 connected to the LEDS. Preferably, the connections on one side of the lamp are female and connections on the other side are male, thereby permitting multiple lamps to be connected to each other in series. Since the LEDs are electrically connected together in series, a shorting cap may be provided at one of the connections 24 to complete the circuit. Connections 24 may be polarized so that the connections cannot be reversed. The unit will operate without the end caps, although the end caps can afford a weather seal and enhance extraction of light.

In one preferred embodiment shown in FIGS. 2-3, lamp 40 includes linearly extending heat sink 12, plural LEDs 14 mounted on heat sink 12 along a length of heat sink 12, and an elongated hollow tube 42 mounted on heat sink 12 in line with LEDs 14, where LEDs 14 are outside tube 42. A first portion 44 of tube 42 farthest from LEDs 14 has an interior surface coated with phosphor 20 and a second portion 46 of tube 42, which is opposite first portion 44 and nearer LEDs 14, is transparent and receives light from the LEDs. LEDs 14 may be mounted on a circuit board 26 that is attached to heat sink 12. First portion 44 of tube 42 may be about half a circumference of tube 42 and second portion 46 may be an opposite half of the circumference.

Phosphor 20 preferably is a cerium-activated yttrium aluminum garnet (YAG:Ce) phosphor coated on an entirety of first portion 44 almost an entire length of tube 42. The thickness of the phosphor coating determines color uniformity and color temperature. The phosphor may be mixed in a water base or in an organic base solution. The process for coating the tube may be the same as the process used to coat tubes in fluorescent lamps. Phosphor 20 may be single layer or multiple layers with different materials and thicknesses. For example, a phosphor-filled elastomeric may be layered over a plastic layer. The layering may vary the index of refraction to improve light extraction. Alternatively, the phosphor may be embedded in the material of the tube (e.g., mixed in the material that is extruded to form the tube).

Lamp 40 may also include a pair of reflectors 48 mounted on heat sink 12 on opposite sides of LEDs 14 and extending a length of tube 42. Reflectors 48 each have a reflective surface 50 that reflects light from LEDs 14 to first portion 44 of tube 42. Reflectors 48 may be aluminum or other suitable material and may be angled ($\theta$ in FIG. 2) to extract more light. Light extraction can be further enhanced by providing additional reflective surfaces on the interiors of the heat sink and end caps and by angling these additional reflective surfaces so that more light reaches the phosphor.

Preferably, reflectors 48 are attached (e.g., with epoxy) to an exterior surface of tube 42 so that the reflectors can perform the additional roles of holding the tube on the heat sink over and in line with the LEDs and setting the distance from the LEDs to obtain uniform light emission from the first portion of the tube (as will be explained below). The epoxy, suitably selected and applied, can make the unit resistant to moisture.

In another preferred embodiment shown in FIG. 4, the three-part cover of the first embodiment (FIG. 2) is replaced with a one-part cover. Lamp 50 includes linearly extending heat sink 12, plural LEDs 14 mounted on heat sink 12 along a length of heat sink 12, and a one-part light emitting cover 52 mounted on heat sink 12 and enclosing LEDs 14. Cover 52 has a first portion 54 opposite LEDs 14 that is arcuate and includes phosphor 20, and second portions 56 that are attached to the heat sink on opposite sides of the LEDs and that have interior surfaces 58 that are reflective and reflect light from LEDs 14 to first portion 54. First portion 54 preferably is semicircular in cross section and second portions 56 are generally flat. An epoxy may be used at the heat sink to seal the interior of the cover from moisture. Phosphor 20 preferably is embedded in a material of the cover (e.g., plastic, such as PET, polypropylene, polyethylene, acrylic formed by extrusion). The cover may be prefabricated in sheets and thermally treated to form the required shape. Alternatively, the phosphor may be coated as in the first embodiment. Interior surfaces 58 of cover 52 may be aluminized to be reflective (this replaces the separate reflectors of the first embodiment).

Figure 5:
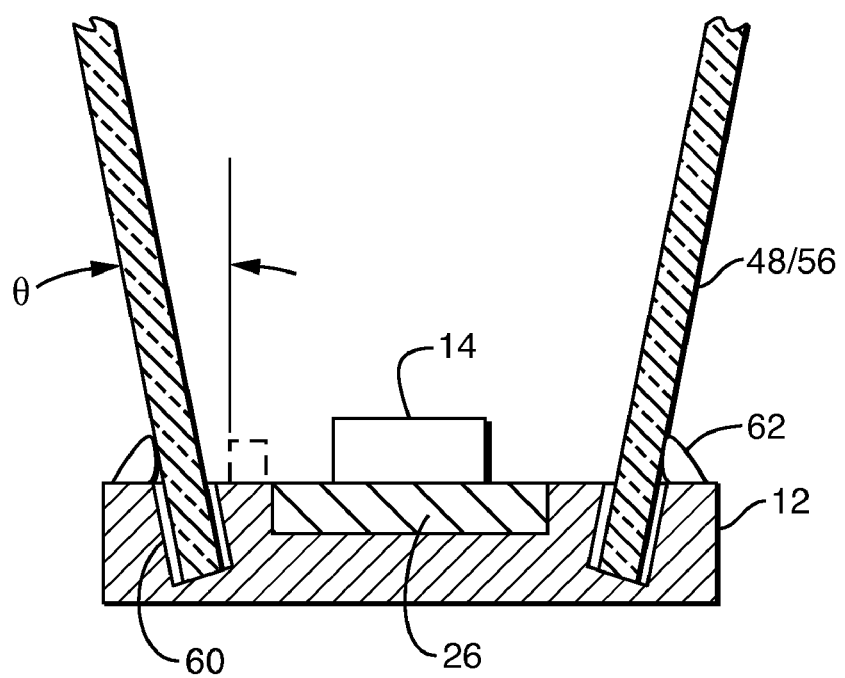
FIG. 5 is a cross-section of the heat sink in an embodiment of the present invention.

Heat sink 12 may have suitably angled slots 60 that receive reflectors 48 of the first embodiment or flat portions 56 of the second embodiment and that are sealed with epoxy 62 as shown in FIG. 5. The end caps may also be angled (e.g., at the same angle as the reflectors) to further facilitate extraction of light.

While the lamp of the present invention may have a size suitable for its particular application, one example is useful for a better understanding of the invention. In the example, the heat sink is 16 inches long, 1 inch wide, and ¼ inches high.

LEDs 14 are blue LEDs that are 1 mm in size and consume about 1 or more watts of power. Ten of these LEDs are mounted on circuit board 26 and spaced along the heat sink about 1.5 inches center-to-center. Tube 42 is about 1 inch in diameter and mounted on reflectors 48 as shown in FIGS. 2-3, and reflectors 48 have an angle $\theta$ of 19° from vertical to facilitate effective extraction of light.

It has been found that the distance h (FIG. 2) from the top of the LEDs to the interior top of the tube and the density of the LEDs are related. If the distance h is too small, the light emitted from the tube may not be uniform. In the example (1 inch diameter tube, 10 LEDs evenly spaced along a 16 inch heat sink), distance h is about 1½ inches. The more LEDs per unit length, the smaller h can be. The reflectors 48 or flat portions 56 can be sized to set the correct distance h.

In the present invention, it has been found that using blue LEDs and separating the phosphor from the LEDs as disclosed herein reduces the thermal load on the phosphor in comparison to white LEDs in the same application. Further, the use of the remote phosphor offers the freedom to replace tubes having different phosphor blends for different color applications without replacing the heat sink and LEDs. Indeed, the heat sink can be easily extruded and adapted to receive circuit boards preassembled with LEDs to further facilitate manufacture of the lamps with diverse characteristics. The LEDs can also be mounted directly on the heat sink provided proper insulation is ensured.

While embodiments of the present invention have been described in the foregoing specification and drawings, it is to be understood that the present invention is defined by the following claims when read in light of the specification and drawings.

We claim:

1. A lamp comprising:
   a linearly extending heat sink;
   plural light emitting diodes (LEDs) mounted on said heat sink along a length of said heat sink; and
   a light emitting, one-part plastic cover mounted on said heat sink and enclosing said LEDs, said one-part, plastic cover comprising an arcuate first portion and two generally flat second portions on either side of said first portion, said first portion containing a phosphor that is embedded in the plastic cover and is excited by light from said LEDs, said second portions having interior surfaces that are reflective and are angled to reflect light from said LEDs to said first portion, said heat sink having two angled slots extending along the length of said heat sink on opposite sides of said LEDs, said angled slots receiving said second portions of said plastic cover for mounting said cover to said heat sink.

2. The lamp of claim 1, wherein said LEDs emit light having a wavelength in a range from 450 nm to 480 nm and wherein said phosphor is a YAG:Ce phosphor.

3. The lamp of claim 1, further comprising end caps at opposite ends of said cover and said heat sink, and said end caps having electrical connections.

4. The lamp of claim 3 wherein the end caps are angled at the same angle as said second portions of said cover.

5. The lamp of claim 3 wherein said electrical connections on one end cap are male and said electrical connections on the other end cap are female whereby multiple lamps may be connected in series.

* * * * *